US006251566B1

(12) United States Patent
Brosh et al.

(10) Patent No.: US 6,251,566 B1
(45) Date of Patent: Jun. 26, 2001

(54) CYLINDRICAL LENTICULAR IMAGE AND METHOD

(76) Inventors: Scott Brosh, 6500 Impala Dr., Arlington, TX (US) 76017; Phil Gottfried, 1207 Oakwood Trail, Southlake, TX (US) 76092

( * ) Notice: Subject to any disclaimer, the term of this patent is extended or adjusted under 35 U.S.C. 154(b) by 0 days.

(21) Appl. No.: 08/949,715

(22) Filed: Oct. 14, 1997

Related U.S. Application Data

(63) Continuation-in-part of application No. 08/762,315, filed on Dec. 9, 1996, now Pat. No. 5,924,870.

(51) Int. Cl.[7] .............................. G03F 7/20; G03B 21/60

(52) U.S. Cl. .......................... 430/321; 430/394; 430/396; 430/397; 430/946; 396/327; 396/330; 359/455; 359/619; 359/621

(58) Field of Search .................................... 430/394, 396, 430/397, 321, 946; 396/330, 327; 359/619, 621, 455

(56) References Cited

U.S. PATENT DOCUMENTS

| | | | |
|---|---|---|---|
| 4,825,234 | 4/1989 | Cai | 354/112 |
| 5,365,294 | 11/1994 | Anderson | 354/112 |
| 5,600,402 * | 2/1997 | Kainen | 355/22 |
| 5,696,596 * | 12/1997 | Taniguchi | 358/300 |
| 5,704,061 * | 12/1997 | Anderson | 396/330 |
| 5,896,230 * | 4/1999 | Goggins | 359/619 |

* cited by examiner

*Primary Examiner*—Mark F. Huff
*Assistant Examiner*—Nicole Barreca
(74) *Attorney, Agent, or Firm*—George R. Schultz

(57) ABSTRACT

A cylindrical lenticular image is made possible by the interlacing of multiple views of an object. The interlaced views are then printed on a substrate and the substrate formed into a cylinder. A lenticular lens is then properly aligned with the substrate. The result is a three dimensional image that can be rotated to reveal a full three-hundred and sixty degree perspective of the imaged object.

43 Claims, 19 Drawing Sheets

Front Perspective of Lenticular Lens

View A

View B

Front Perspective of Ronchi Ruling

View A

View B

Cylinder Surface Perspective Orientation

Side Views of Cylinder

Tapered Cylinder Surface Flat View

Tapered Cylinder Seam Side View

Tapered Cylinder Perspective Sequence

Tapered Cylinder Surface Perspective Sequence Orientation

Tapered Cylinder Lenticular Orientation

Center Phase Alignment Pattern

Alignment Pattern and Lenticular Image Orientation

CYLINDRICAL LENTICULAR IMAGE AND METHOD

CROSS-REFERENCE TO CO-PENDING APPLICATION

This application is a continuation-in-part of co-owned U.S. Ser. No. 08/762,315 entitled "Lenticular Image and Method" filed on Dec. 9, 1996, which application is now U.S. Pat. No. 5,924,870.

TECHNICAL FIELD OF THE INVENTION

The present invention relates to a method of producing a cylindrical lenticular image that provides a three dimensional and/or animated image of an object. The image provides a full rotational view of the object by interlacing a plurality of views of the object under a lenticular lens which is formed in a cylinder.

BACKGROUND OF THE INVENTION

Lenticular imagery is an inexpensive alternative to photographic holograms. The images can be created by interlacing several views of a single image and then viewing the interlaced images through a lenticular lens. The lenticular image can give the perception of depth to the interlaced image. The lens, however, is generally flat and movement of the interlaced image is achieved by varying the viewing angle of the flat lens. Many aspects of lenticular imaging are disclosed in co-pending application U.S. Ser. No. 08/762,315, the specification of which is incorporated by reference.

Attempts have been made to produce a three dimensional image which can be rotated to view the image from a different angle. For example, U.S. Pat. No. 5,365,294 to Anderson discloses a method and apparatus for creating cylindrical three dimensional pictures. To produce the three dimensional images, a multiple imaging camera is positioned to take multiple, sequential images of a subject as the subject is rotated 360 degrees, creating a first sequential film strip depicting the subject from all angles of rotation. The images of the first film strip are then projected sequentially frame-by-frame through the lenticular lens and onto a second film strip surrounding an exposure cylinder as the cylinder is rotated 360 degrees. The exposure cylinder is enclosed within a housing having a vertical aperture for exposing the second film strip as the exposure cylinder is rotated within the housing. The aperture has a width equal to the subtended chord of the lobe angle of the lenticular lens. In another embodiment, the rotating subject is photographed with a conventional viewing camera modified by replacing the film holder with the housing and exposure cylinder mounted therein. A film strip is mounted onto the cylinder and surrounded by a lenticular lens. The vertical aperture is in alignment with the camera aperture for exposing the film through the lenticular lens. As the rotating subject is photographed, the exposure cylinder rotates within the housing at a rate of speed equal to the rate of rotation of the subject, thereby exposing the film strip through the lenticular lens as the exposure cylinder rotates past the aperture.

Once exposed through the lenticular lens, the film strip is processed and the resulting photograph mounted surrounding a viewing cylinder having the same circumference as the exposure cylinder or same width as the linearly exposed film strip. A lenticular lens surrounds the photograph to create an illusion of the subject being reduced in size and encased within the cylinder. In production, the lenticular lens and second film strip consist of a film strip separate from the lenticular lens, or a unitary strip having the lenticular lenses extending transversely across the width of the film strip on one side with the photo emulsion bonded to a second side of the film strip opposite the lenticular lenses. The unitary strip is unwound from a first film canister, and is rotated around the exposure cylinder for sequential exposure of the entire length of film to a continuously repeated series of 3 D images, and subsequently wound onto a second film canister where the film is stored until it is processed. Once the lenticular film strip has been processed, each repeated series photographed is cut into a separate length equal to the circumference of the exposure/viewing cylinder. Thus, many separate cylindrical three dimensional pictures may be produced continually from a length of the unitary lenticular film strip.

The Anderson method has the serious drawback of requiring the film to be exposed through a lenticular lens with the lens and film moving together in a fixed relation to a set or projected image which diminishes the quality of the resulting image. A need exists for a method to interlace the multiple angle views resulting in a sharper image. This method needs to allow for interlaced images to be customized for any lenticular geometry. Further, a computerized method would provide a wider variety of image sources and reproduction processes.

SUMMARY OF THE INVENTION

The present invention relates to a method of producing a cylindrical lenticular image. In one embodiment of the invention, the method involves the use of multiple images of a single object taken from different angular perspectives. The images are interlaced according to a specified pattern. The image is then placed under a lenticular lens which in turn is formed into a cylinder. The cylinder can be illuminated from a source within the cylinder. When the cylinder is rotated, the viewer is presented with a number of views, each of which contains information for a specific image in the interlaced pattern. As the cylinder is rotated, the viewer observes a number of sequential images. If the interlaced image involves multiple perspectives of a single object, the viewer sees the illusion of the three dimensional image centered in the center of the cylinder. The interlaced images could also involve an object in motion, in which case, the rotation of the cylinder will produce a three dimensional object in motion.

The number of images interlaced and the resolution of the lenticular image is affected by the geometry of the lenticular lens used as well as the diameter of the cylinder. In one embodiment, a length of lenticular image and lens are not fixed to a cylinder, but merely pulled over a cylindrical viewing surface. A novel method of aligning the image and lens is also disclosed.

BRIEF DESCRIPTION OF THE DRAWINGS

For a more complete understanding of the present invention, and for further details and advantages thereof, reference is now made to the following Detailed Description taken in conjunction with the accompanying drawings, in which.

DETAILED DESCRIPTION OF THE DRAWINGS

Figure 1:
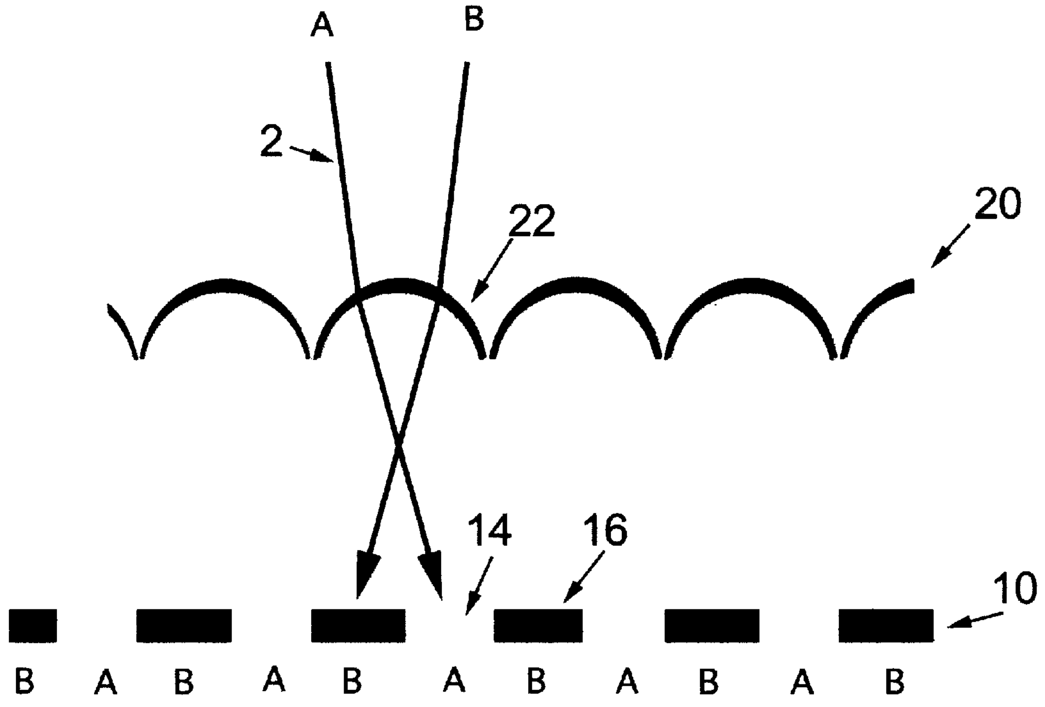
FIG. 1 is an illustration of a sectional view across the lenticular image showing a background image of interlaced A and B images covered by a lenticular lens.
Figure 1A:
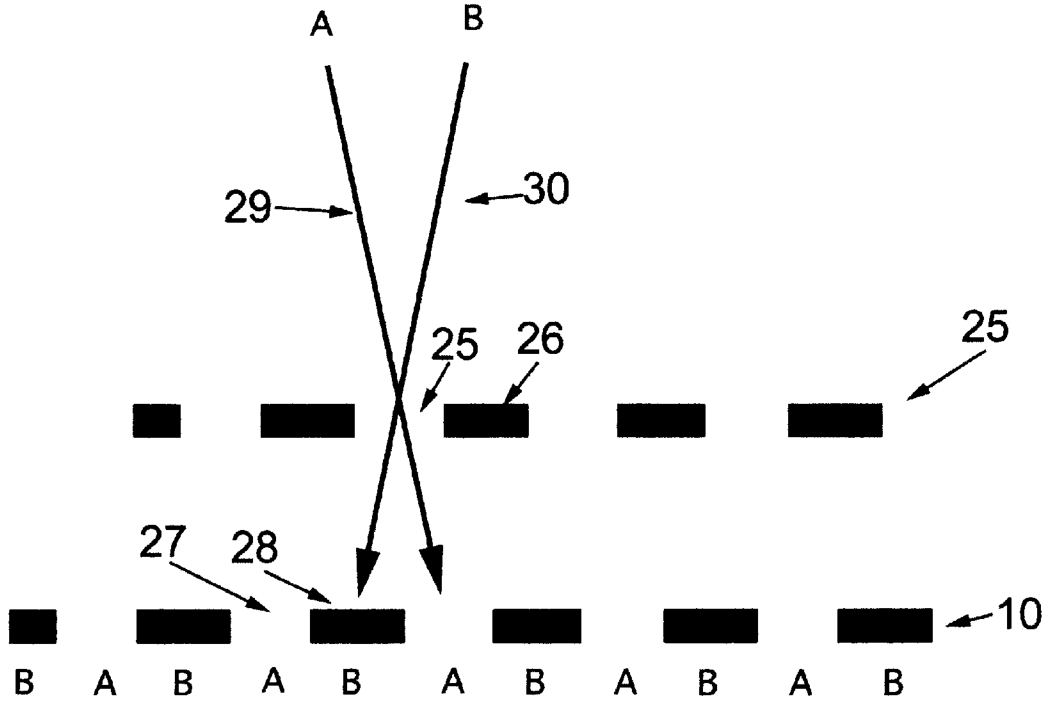
FIG. 1*a* is an illustration of a sectional view across a Ronchi ruling image showing a background image of interlaced A and B images covered by a Ronchi ruling.

Imaging lenticular images for a cylinder format with an image source and lenticular lens or mask in a fixed relation and projected on a repositionable recording medium overcomes many of the disadvantages found in the prior art. The method produces remarkable depth and clarity of image. Yet, the method is economical in comparison with earlier methods. FIG. 1 illustrates the operation of a lenticular image 10 through a lenticular lens 20. The observer at angle 2 sees image 14, also designated A, in this example a white field, while the second image 16, or B, is simply a black field. The curvature of the lens 22 and the refractive index of the lens material separate and focus the different views. This principal works in reverse when exposing photo-sensitive material through the lens. FIG. 1*a* illustrates the operation of a lenticular image 10 through a Ronchi ruling. In this case a linear aperture 25 is created between the opaque areas 26 which act like a pin hole used in the camera obscura. The aperture 25 separates the images 27, 28, also designated A and B, as observed from angles 29, 30. This principal works in reverse when exposing photo-sensitive material through the ruling. It can also be observed that the underlying image used with the lenticular lens and the Ronchi ruling are the same. It is important to note that the underlying image has stripes 27, 28 that are the same width as the aperture 25 of the Ronchi ruling. Therefore the interlaced image could be created from the Ronchi ruling by masking the image area of image A while exposing image B and after being offset perpendicular to the ruling the width of one stripe masking image B while exposing image A. Upon this observance it becomes apparent that this masking process could be performed with a computer, using various algorithms, and printed on a substrate for viewing with the lenticular lens or Ronchi ruling.

The underlying image can of course be significantly more complex than the simple black and white fields. For example, the appearance of action could be achieved using this method. If the first image is a batter preparing to swing his bat, then the second image could be the batter in mid swing. These images can be interlaced and placed under a lenticular lens. The viewer, depending on his viewing angle could see the batter from the first image, and then by moving his head or by moving the interlaced image, he could see the second image of the batter in mid swing. The transition between the first and second images can be minimized by adding additional views. In other words, this method is not limited to two images. Instead many sequential shots can be interlaced to create the sense of action during viewing.

A lenticular lens and a Ronchi ruling are related by their frequential geometry, known as the frequency usually expressed in lines per inch. The pitch of a lenticular lens is measured as the width of a hemi-cylindrical lens unit, i.e. from valley to valley or peak to peak. A Ronchi ruling is measured as the number of opaque and transparent pairs, i.e. from one edge of an opaque stripe to the opposite side of the adjacent transparent stripe. The relationship between image resolution and the frequential geometry can be illustrated by the following example. The pitch is equal to the inverse of the spatial frequency per inch. In other words, if the pitch is 0.0125 inches, then the frequency is 80 lines or lenticules per inch. If twelve images are desired, then the resolution of the image could be 12 images times 80 lines per inch, resulting in a resolution of 960 dots per inch. A Ronchi ruling with transparent areas of 1/960th of an inch in width separated by opaque portions of 11/960th of an inch could be used to mechanically mask a photo-sensitive material moving the ruling perpendicular to the ruling in 1/960th of an inch steps for masking the subsequent images. A computer can be employed to perform this masking or interlacing process. When interlacing with the computer certain fractional frequencies will not be represented exactly by a whole number of dots per inch and/or it is desired that the frequency of the interlaced image be slightly larger or smaller than the lenticular lens or Ronchi ruling. In this case the image data can be dithered, a method of averaging image data, using resolution changes or shrinking/expanding the output width of the interlaced pattern. The images can be stored in any suitable format and output on a variety of digitally controlled output devices. These adjustments could also be accomplished by enlarging or reducing an exposed photo-sensitive material optically or electronically. Another method involves using a frequency for the masking or interlacing that is different from the Ronchi ruling or lenticular lens used for viewing the image.

Figure 4A:
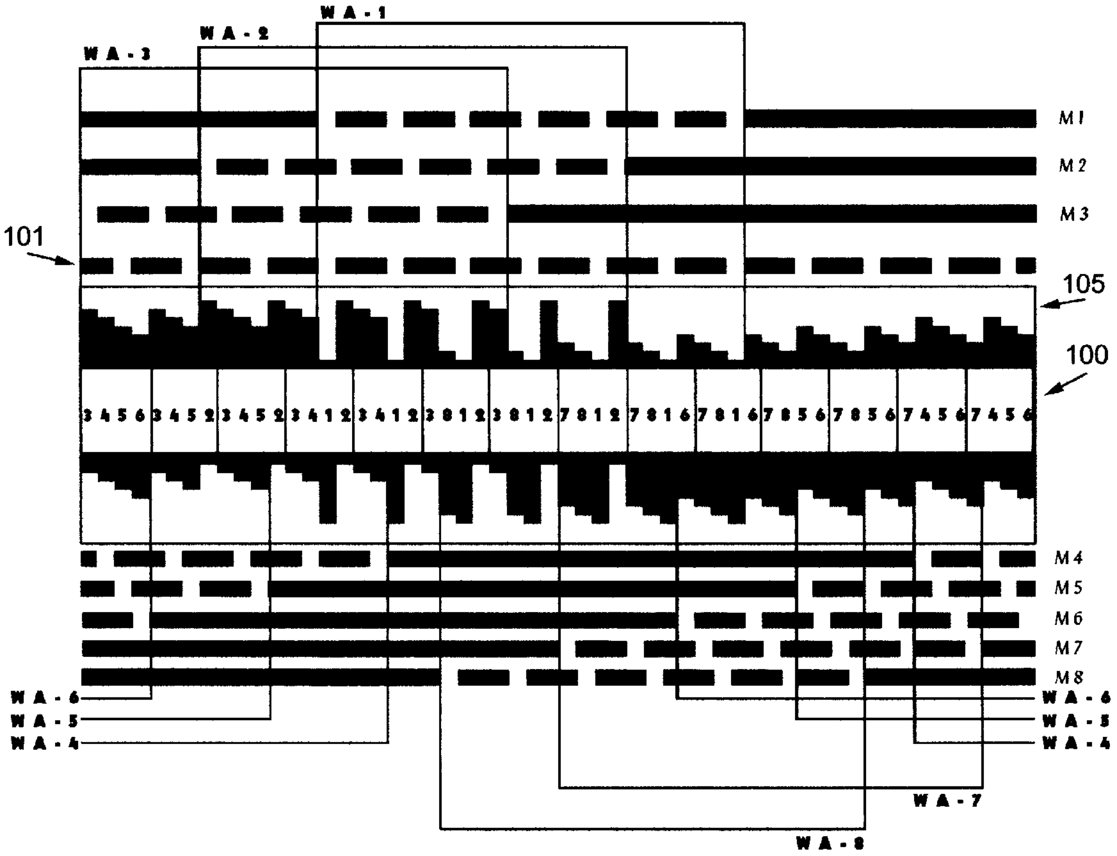
FIG. 4*a* illustrates a cylindrical lenticular pattern created from a Ronchi ruling.
Figure 4B:
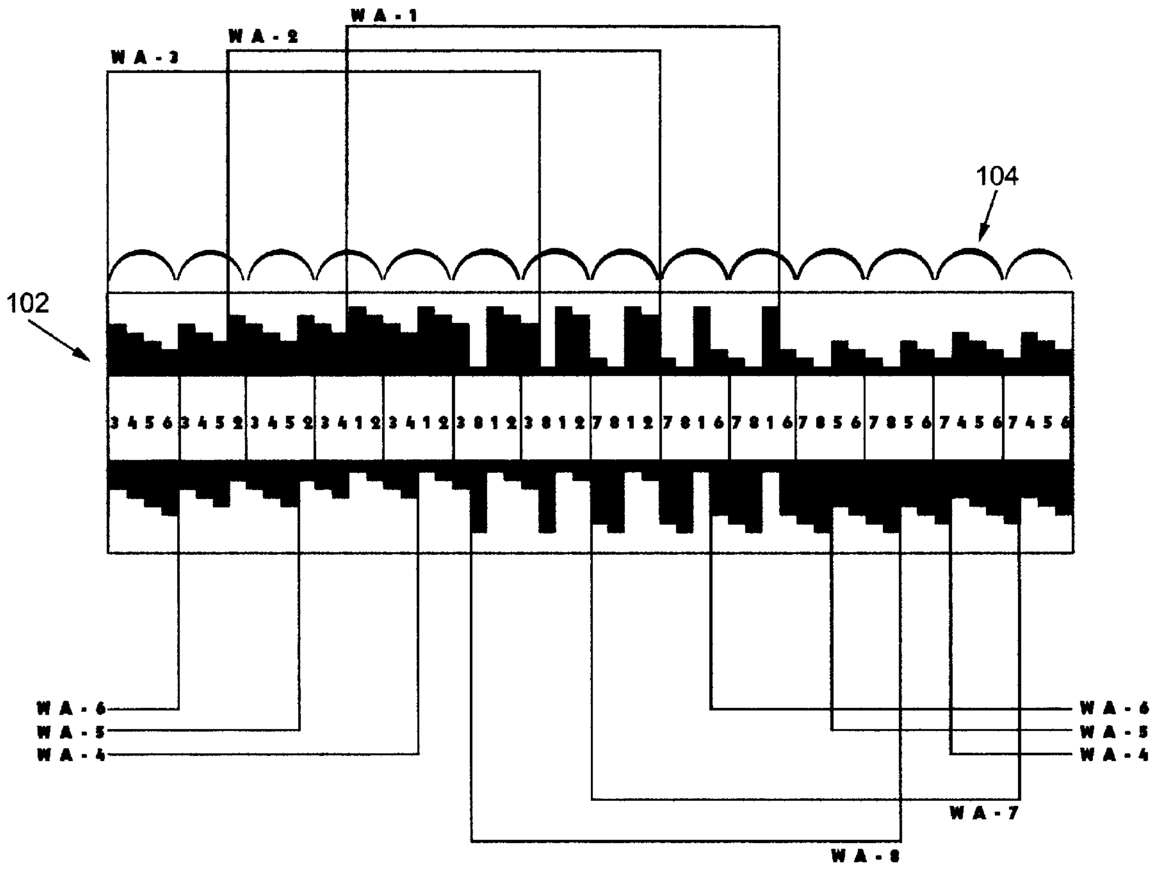
FIG. 4*b* illustrates a cylindrical lenticular pattern created by a computer.
Figure 5:
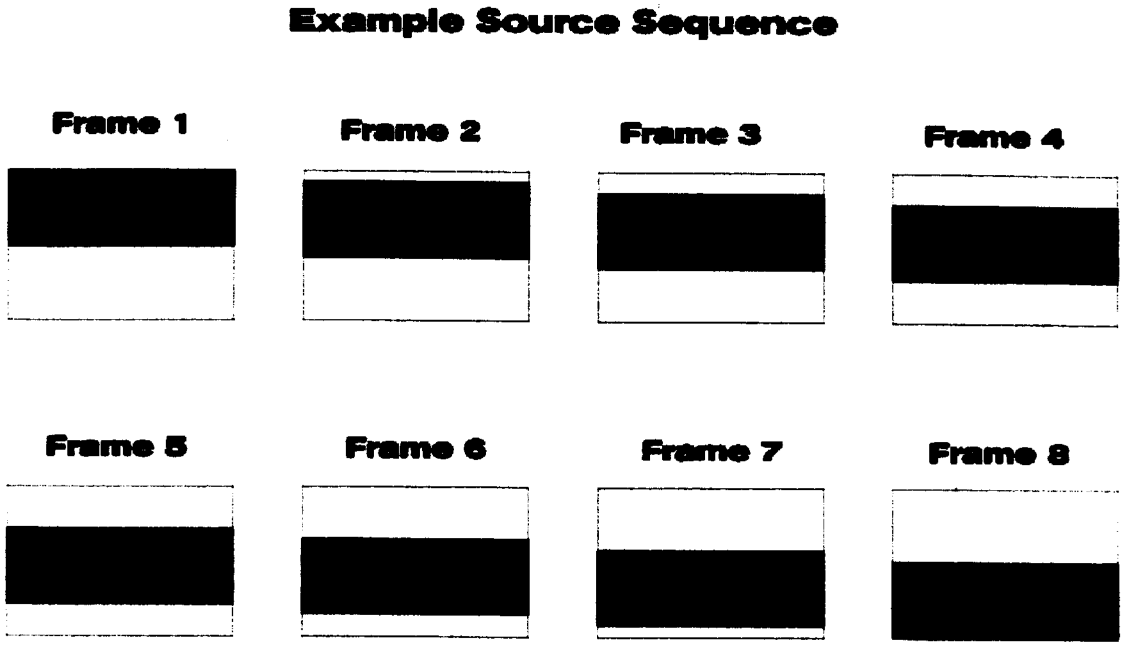
FIG. 5 illustrates the sequence of images used to make patterns 4*a* and 4*b;*

FIGS. 4*a* and 4*b* are flat views of an interlacing pattern which partially embodies the present invention. FIG. 4*a* represents the interlacing pattern 100 created from a Ronchi ruling 101 that is 75% opaque and 25% transparent, i.e. a ruling phase of four (4), using the image sequence illustrated in FIG. 5 depicting a black band moving from top to bottom over the course of eight frames. The pattern 100 was created by using the Ronchi ruling as a mask for exposing a photo-sensitive material. The exposed pattern is 14 opaque and transparent pairs in width. The masks, labels M1–M8, are used to expose each area, labeled WA1–WA8, have seven transparent stripes, six opaque stripes are opaque outside of the area being exposed. Each area WA1–WA8 is 7 opaque and transparent pairs in width. The exposed seven stripes are offset to the left of the previous exposure by a distance equal to (the ruling offset, a selected whole number, times the ruling phase) minus one (1). In the example the ruling phase is four (4) and the ruling offset is two (2) giving stripe offset of seven (7). Notice that exposures WA4, WA5 and WA6 have stripes that are discontinuous yet the relative position of the stripes is maintained. It should be noted that the masking process can be achieved with separate masks for each exposure as illustrated or that the exposures can be made by moving the photo-sensitive material in relation to a fixed mask or the mask moved in relation to a fixed photo-sensitive material. Also a lenticular lens of sufficient resolving power could be substituted for the Ronchi ruling. During all exposures the images must be projected by a light source that is fixed in a perpendicular relation to the Ronchi ruling or lenticular lens used for the masking process.

FIG. 4*b* represents the interlacing pattern 102 as generated by a computer. The resulting pattern is identical to that of FIG. 4*a*. A lenticular circumference of 14 lenticules is represented by 104, a profile of an example lenticular sheet. Each image, labeled 1–8, in the sequence 102 is rendered as seven pairs of opague and transparent stripes, with the width of each opague, or image stripe being equal to (a unit of measure of width per lenticule divided by the number of image stripes per lenticule). The width of these seven pairs of stripes is known as the aperture and are labeled WA-1 through WA-8, respectively for images 1–8. The apertures are ordered in a cascading overlap pattern defined by the product (of the lenticular offset, a selected whole number, times the number of stripes per lenticule) minus one stripe. In the example the number of image stripes per lenticule or lenticular phase is four and the lenticular offset is two lenticules giving an image stripe offset of seven. Stripes each aperture is offset to the left of a preceding apeture by the stripe offset. The work aperture WA4, WA5 and WA6 have discontinuous stripes that maintain the relative position with their respective adjacent stripes.

The resulting pattern shows that each aperture has a number of stripes equal to the lenticular offset to the right of subsequent apertures and that the right most stripe of each aperture is aligned to the right of the previous aperture's stripe that is the lenticular offset plus one from the right side of the aperture. It can be further observed that the left most stripe of each aperture is aligned to the left of the next aperture's stripe that is the lenticular offset plus one from the left side of the aperture. If this pattern were viewed through a lenticular lens formed into a cylinder and rotated to the right a black bar would appear to move from top to bottom and snapping to the top at 360 degrees. Rotating to the left would reverse the viewed sequence. The cylinder can be oriented horizontally and rotated causing the black band to move sideways.

Figure 1B:
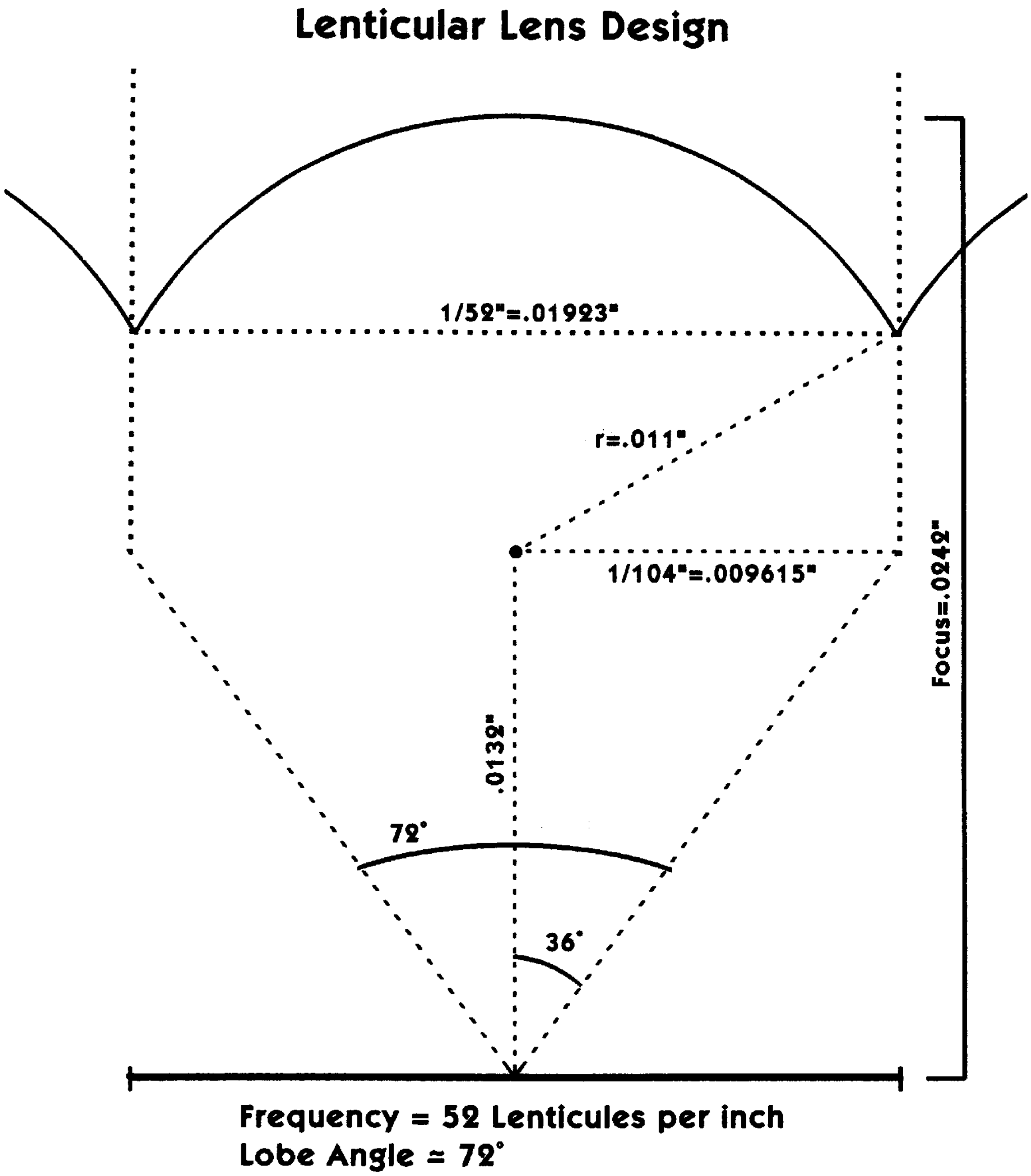
FIG. 1*b* illustrates a 52 lpi lens design.
Figure 2:
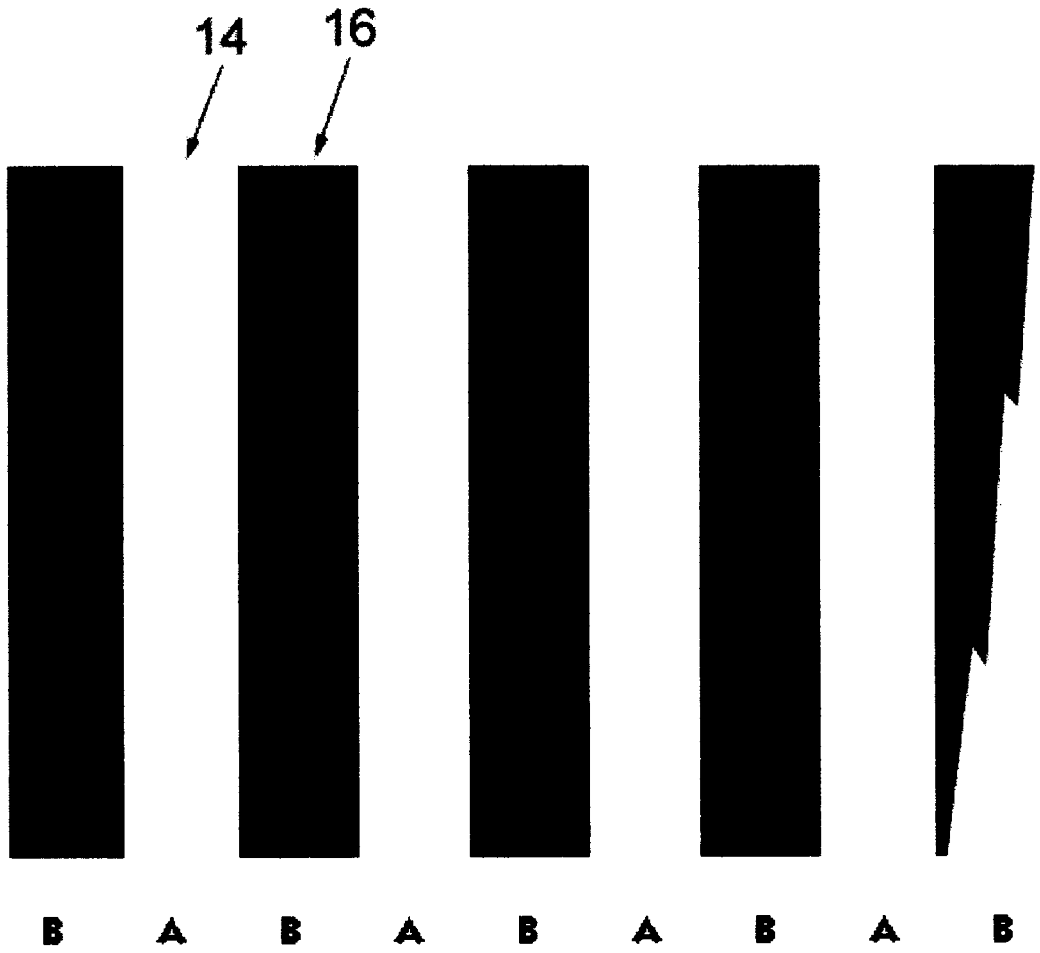
FIG. 2 is a top view of the A and B inputs interlaced.
Figure 3A:
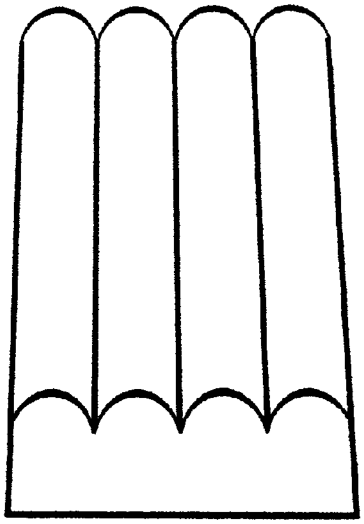
FIG. 3*a* is a view through the lenticular lens at an angle that only reveals input A.
Figure 3B:
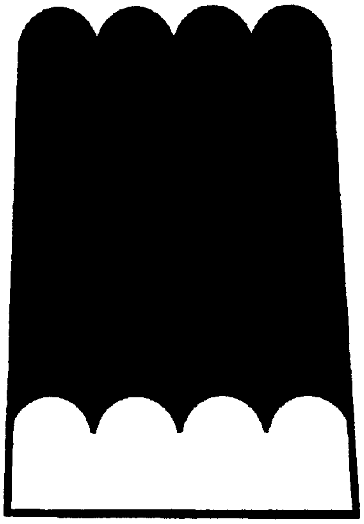
FIG. 3*b* is a view through the lenticular lens at an angle that only reveals input B.
Figure 3C:
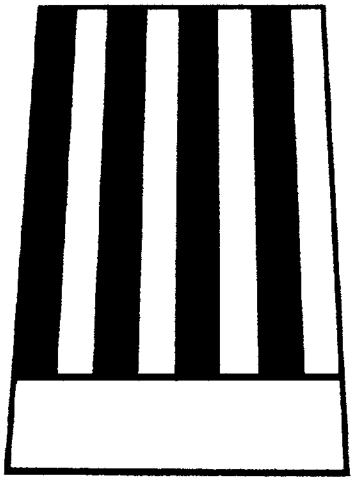
FIG. 3*c* is a view through the Ronchi ruling at an angle that only reveals input A.
Figure 3D:
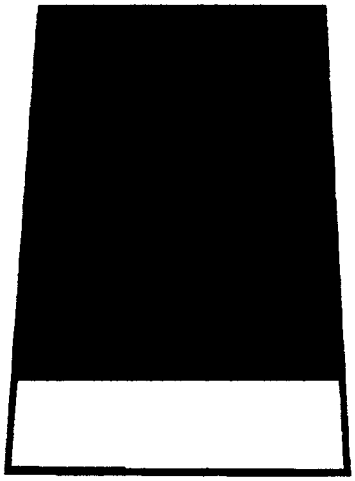
FIG. 3*d* is a view through the Ronchi ruling at an angle that only reveals input B.

The example cylindrical lenticular pattern thus described is for illustrative purposes using a theoretical lenticular lens with 14 lenticules equal to the circumference of a cylinder. In a preferred embodiment of the invention, a lenticular lens with 52 lenticules per inch is to be formed into a three inch diameter cylinder and a lenticular lens, FIG. 1*b*, has a lobe angle or viewing angle of 72 degrees. In practice, the width of each image in the sequence can be between 15 percent and 50 percent of the circumference of the cylinder. The viewing angle corresponds to the aperture as one fifth of the circumference of the cylinder of ~9.424 inches giving an aperture of ~1.884 inches. At this point, the circumference and aperture measurements are converted from inches to the number of lenticules, in this case ~98.017 lenticules per aperture and ~490.088 lenticules per circumference. Each lenticule then represents ~0.7345 degrees, i.e. 360/490.088 degrees of the circumference. The lenticular phase is equal to the lenticules per aperture divided by the lenticular offset and rounded to a whole number. Thus, lenticular offset of one (1) gives 98 phases, 98.017 lenticules per aperture divided by 1 and rounded to a whole number. An offset of four (4) gives 24 phases. The actual lenticular offset chosen must take into account the resulting number of stripes per inch, the inverse of stripe width which is calculated as the lenticular phase times the number of lenticules per inch of the lenticular lens, e.g., 5096 stripes per inch at an offset of one (98 phases×52 lenticules per inch) and 1248 stripes per inch at an offset of four with the 52 lpi lens. Likewise the number of images in the sequence is calculated as the lenticules per unit of radial circumference divided by the lenticular offset and then rounded to a whole number. The lenticular offset of one (1) would require 490 frames while an offset of four requires only 122 frames. Each frame would then have a "stripe offset" to the left of the previous frame calculated as the lenticular offset times the lenticular phase at the selected lenticular offset minus one. The lenticular offset of one gives a stripe offset of 97 (offset of 1×lenticular phase of 98−1) while a lenticular offset of four gives a stripe offset of 95 (offset of 4×lenticular phase of 24−1). For the actual rendering of the cylindrical lenticular pattern the number of stripes per aperture is calculated as the stripe offset plus one times the lenticular phase. The number of stripes per circumference is the stripe offset times the number of frames in the sequence. At a lenticular offset of one the aperture will contain 9,604 stripes and the circumference will contain 47,530 stripes, while at a lenticular offset of four, the aperture will contain 2,304 stripes and the circumference will contain 11,590 stripes. It will be observed that the pitch of the lenticular lens material is rarely equal to the lenticules per inch designation assigned to it. This variance combined with rounding whole numbers and the relationship of linear measure to circular measure results in a slight difference in actual circumference of the cylindrical surface defined by the diameter of the cylinder and the circumference of the rendered image. This difference will be equal to at least 360 degrees divided by the viewing angle, or one lenticule per circumference width divided by the aperture width. Before the image is output to a digital imaging device the image data may be dithered to match the resolution of the device. An additional dithering may be applied to the image data shrinking or expanding the lenticular pitch of the cylindrical lenticular pattern to match the exact frequency of the lenticular lens pitch and compensate for the differences mentioned. These affects can be minimized by round up instead of down in certain circumstances.

Figure 6:
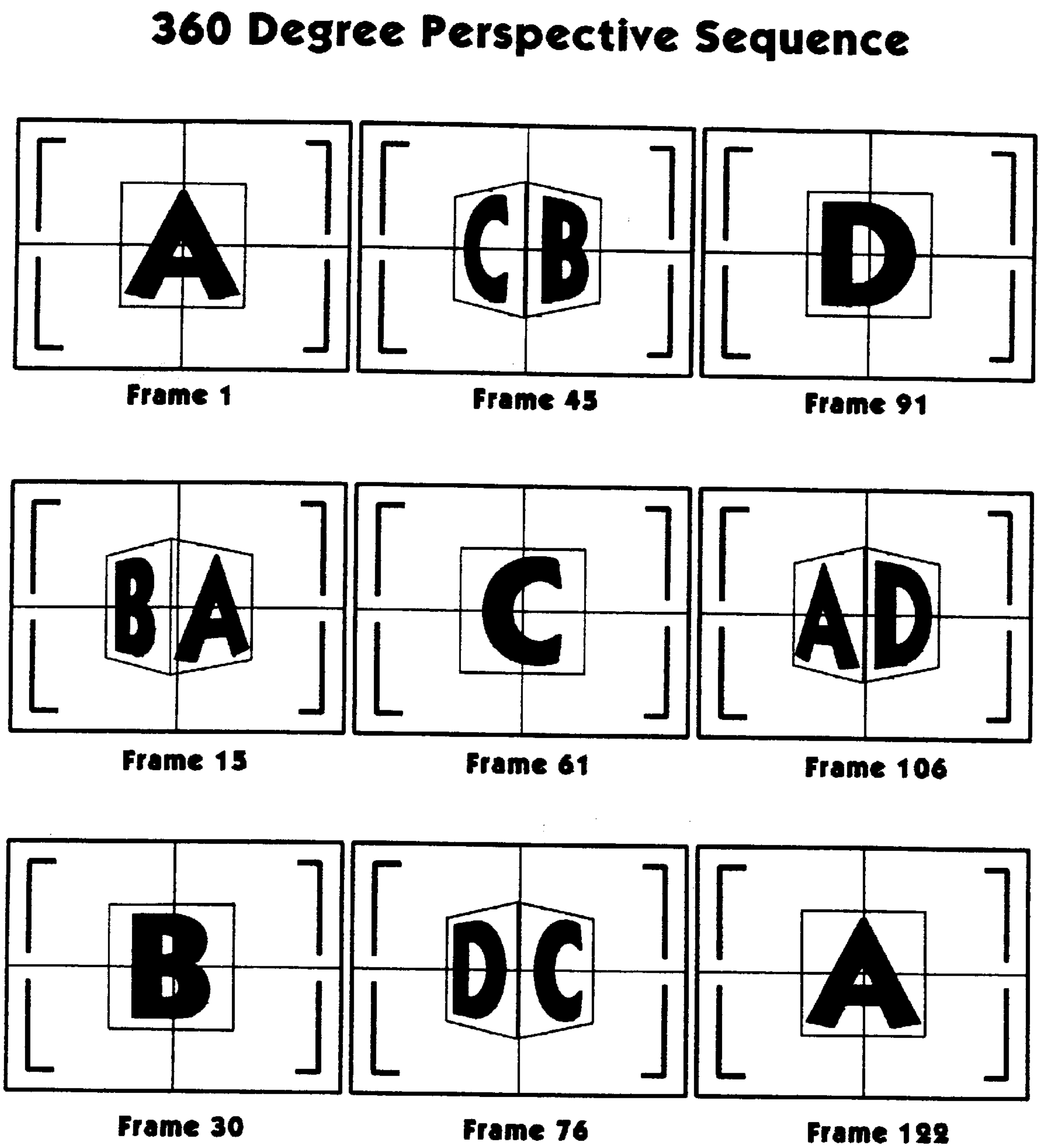
FIG. 6 illustrates a 360 degree perspective sequence.
Figure 7A:
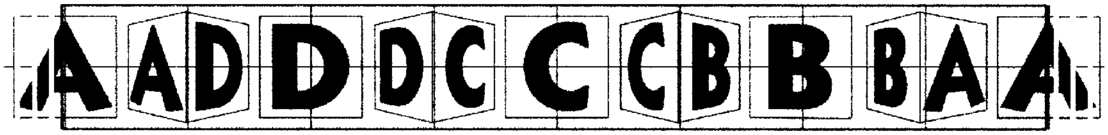
FIG. 7*a* illustrates the relationship of the 360 degree perspective sequence orientation to the flat view of a cylindrical surface.
Figure 7B:
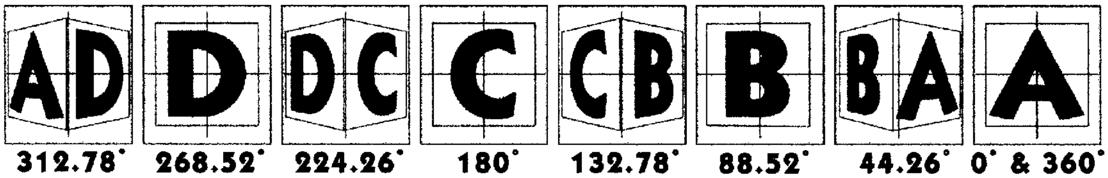
FIG. 7*b* illustrates the 360 degree perspective sequence orientation to the rotating cylinder.

In the preferred embodiment the image sequence represents a 360 degree perspective of an object taken at discrete angles around a center point, as shown in FIG. 6. The angle of change around the center is equal to 360 degrees divided by the number of frames required for the cylinder diameter and lenticular lens pitch utilized. The direction of rotation should be from left to right, i.e., counter-clockwise. A right to left rotation, i.e., clockwise, can be used if the cylindrical lenticular pattern is reversed. In the above example the angle would be 0.73469 degrees at the lenticular offset of one and 2.9508 degrees at a lenticular offset of four. FIG. 7*a* represents a flat view of a cylindrical surface showing the orientation of the images in the perspective sequence in relation to the surface and each other. Only nine of the 122 images are included in the illustration. When the cylindrical lenticular pattern is output and viewed through the lenticular lens formed into a cylinder of the desired diameter the object appears to float in the center of the cylinder. Rotating the cylinder allows the object to be viewed as rotating incrementally inside the center of the cylinder as shown in FIG. 7*b*. If the object in the scene is in motion when the 360 degree perspective views are made the object will appear to animate in 3D.

Figure 7D:
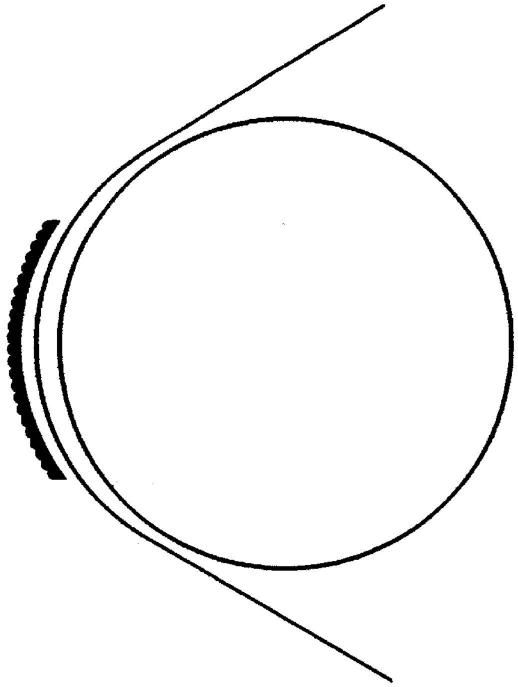
FIG. 7*d* illustrates fixed lenticular lens in relation to a moving cylindrical lenticular pattern strip.
Figure 7E:
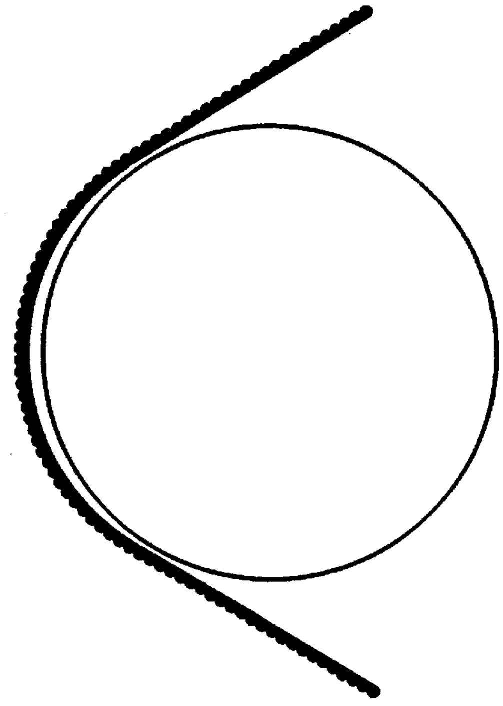
FIG. 7*e* illustrates a cylindrical lenticular pattern strip that is longer than the circumference of the cylinder used to define the pattern.
Figure 7C:
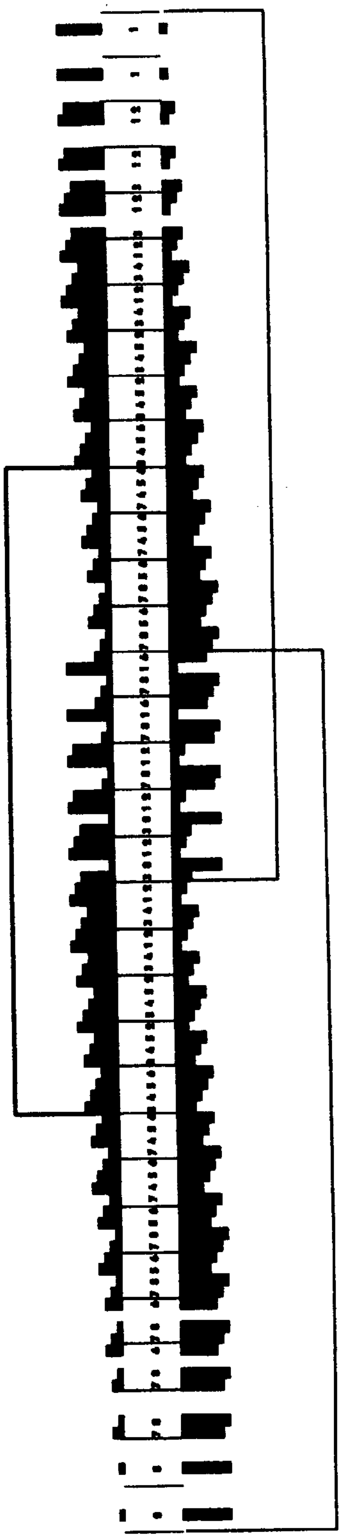
FIG. 7*c* illustrates a cylindrical pattern strip mounted to a lenticular lens and moving over a curved surface.

A second embodiment provides for the image sequence to be a single perspective of an object in motion. Rotating the cylinder replays the image sequence in the center of the cylinder. A third embodiment rotates the single perspective sequence 90 degrees in relation to the lenticular lens so when the cylinder is oriented horizontally and rotated, the image sequence is replayed in the center of the cylinder. A fourth embodiment allows for a sequence with more frames than the number defined by a cylindrical diameter, resulting in a cylindrical lenticular pattern that is longer than the circumference defined by the diameter. FIG. 7*c* shows a cylindrical lenticular pattern made from repeating the frames used to make FIGS. 4*a* and 4*b*. The pattern shows the transition between the first iteration of the image sequence and the second. Note, that there are no discontinuous stripes in this example pattern. The cylindrical lenticular pattern strip is replayed using a curved lenticular lens or Ronchi ruling that is fixed in position while the cylindrical lenticular pattern is moved across the frequential pattern of the lens or ruling as shown in FIG. 7*d*. The portion of the image under the curved lens or ruling must maintain a fixed distance from the curve as the pattern moves, typically adjacent. In the example the space between the cylindrical lenticular pattern strip, the lenticular lens and the curved surface are exaggerated. Only a portion of the cylindrical lenticular pattern is shown. A lenticular lens or Ronchi ruling of sufficient length could instead be fixed to the cylindrical lenticular pattern and viewed moving across a curved surface as shown in FIG. 7*e*. The image sequence used to create a pattern strip as described could be a non repetitive sequence of virtually unlimited length. A continuously looping pattern strip can be created by providing for the discontinuous strips where the ends of the pattern strip are joined as shown previously.

Figure 8:
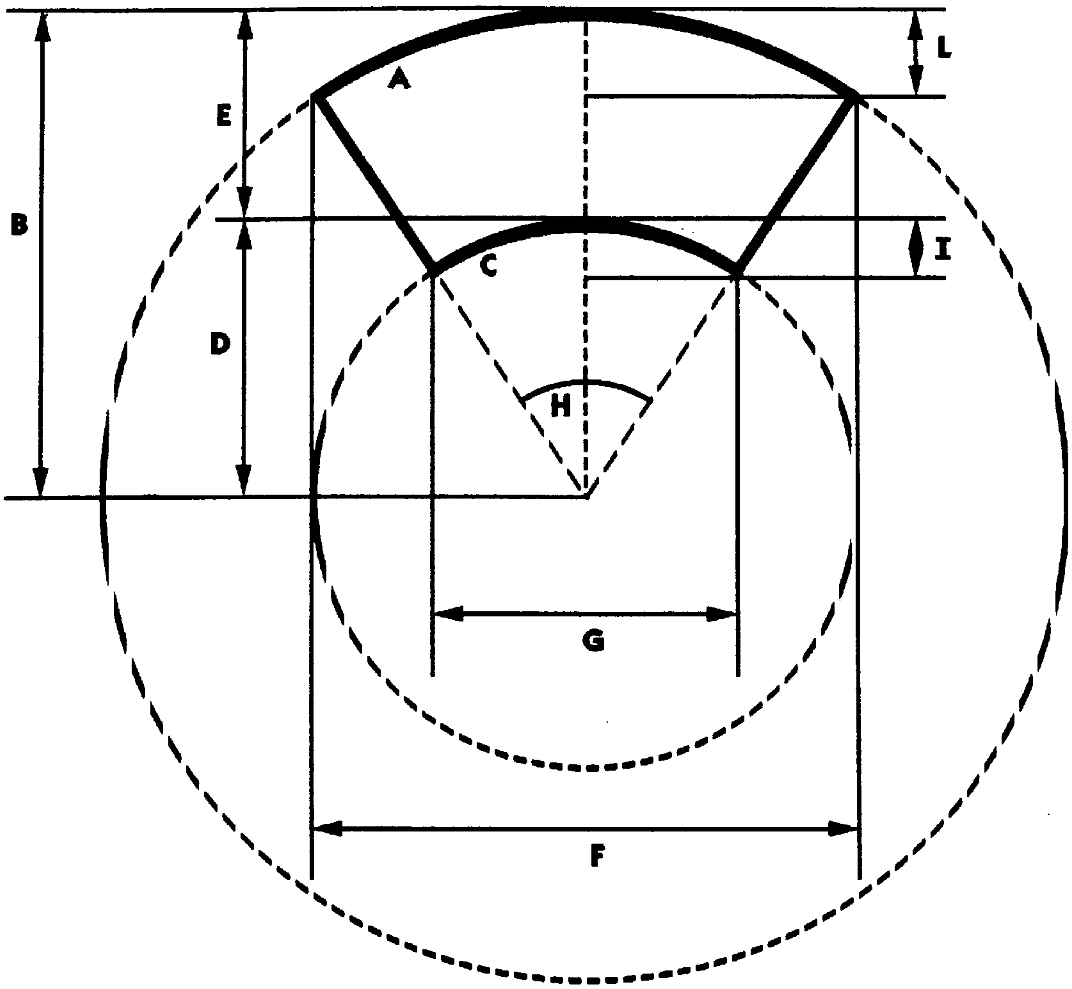
FIG. 8 illustrates the dimensional relationship of a tapered cylindrical surface flat view to a radial center point.
Figure 9:
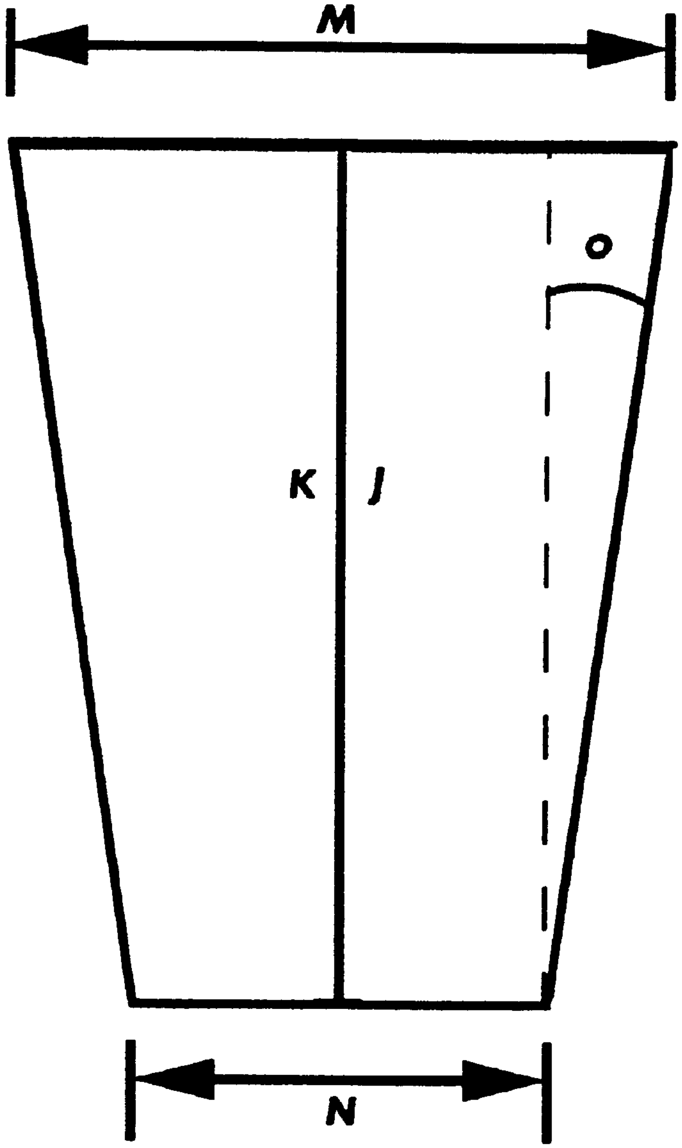
FIG. 9 illustrates the dimensional relationship of a tapered cylinder to the associated flat view edges that join to form the tapered cylinder.

A fifth embodiment provides for the cylindrical lenticular image to be wrapped around a cylinder having top and bottom diameters that are different as in a stackable drinking cup. FIG. 8 illustrates a flat view of the outer surface of a tapered cylinder. The top curve A is defined by the top curve radius B and the bottom curve C is defined by the bottom curve radius D. The top curve and bottom curve are separated by the tapered cylinder side length E which is equal to the top curve radius minus the bottom curve radius. A top curve chord length F and bottom curve chord length G are defined by the angle HK referred to as the radial or cup angle. The distance I from the bottom curve chord to the bottom curve is referred to as the Cup Rise. When the flat view is formed into a tapered cylinder the edges J and K are joined together as illustrated in FIG. 9, a side view of the tapered cylinder. The diameters of the top and bottom of the tapered cylinder, labeled M and N, are defined by the following formulas.

Tapered Top Diameter $$TD=((2*\text{Top Curve Radius}*\pi)*(\text{cup angle}/360))/\pi$$

Tapered Bottom Diameter $$BD=((2*\text{Bottom Curve Radius}*\pi)*(\text{cup angle}/360))/\pi$$

The taper angle O is proportionately related to the cup or radial angle by the ratio of one to two times π. If the angle of the taper and the radial surface angle are unknown, as in the dimensions of a tapered cup label, the taper angle can be calculated by the following formula.

$$\text{Taper Angle}=TAN^{-1}\ ((TD-BD)/2)(\text{Top Curve Radius}-\text{Bottom Curve Radius}))$$

Figure 10:
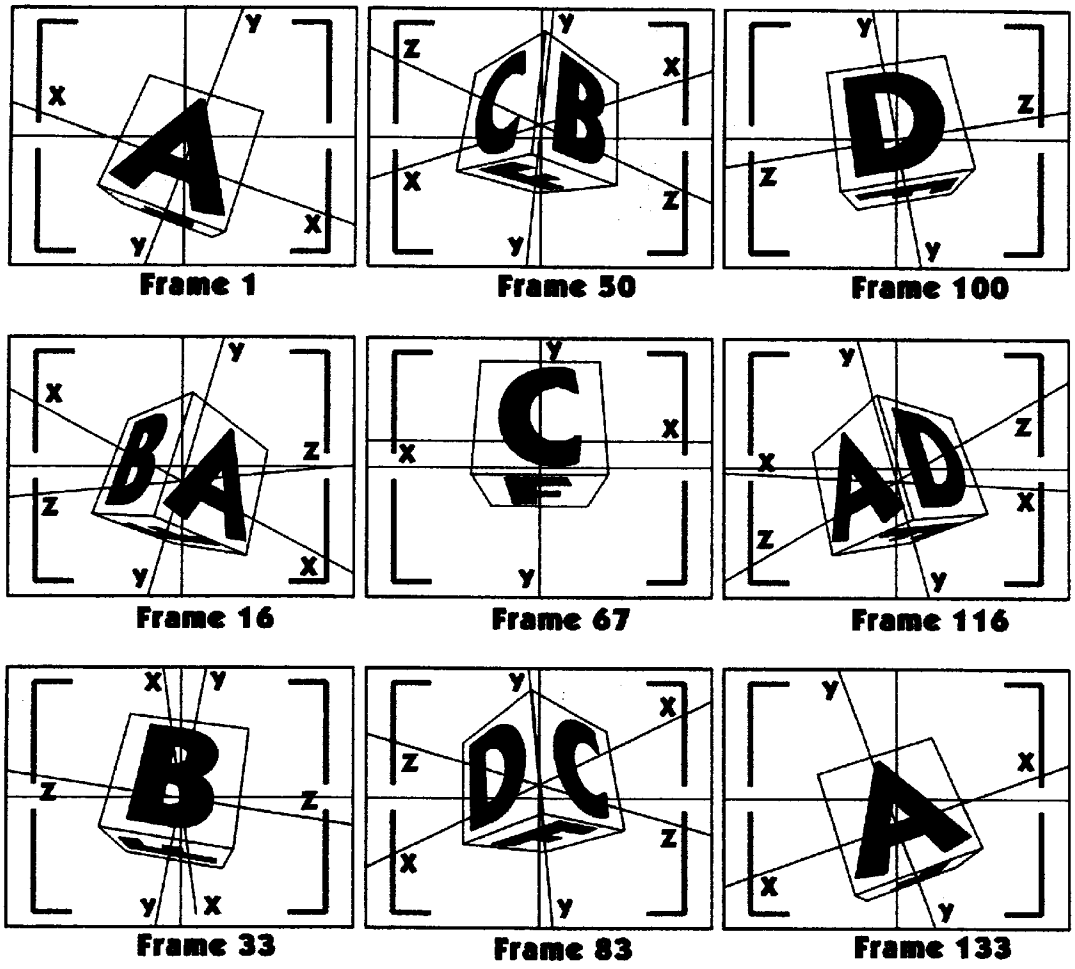
FIG. 10 illustrates a tapered cylinder perspective sequence of a cube.
Figure 11:
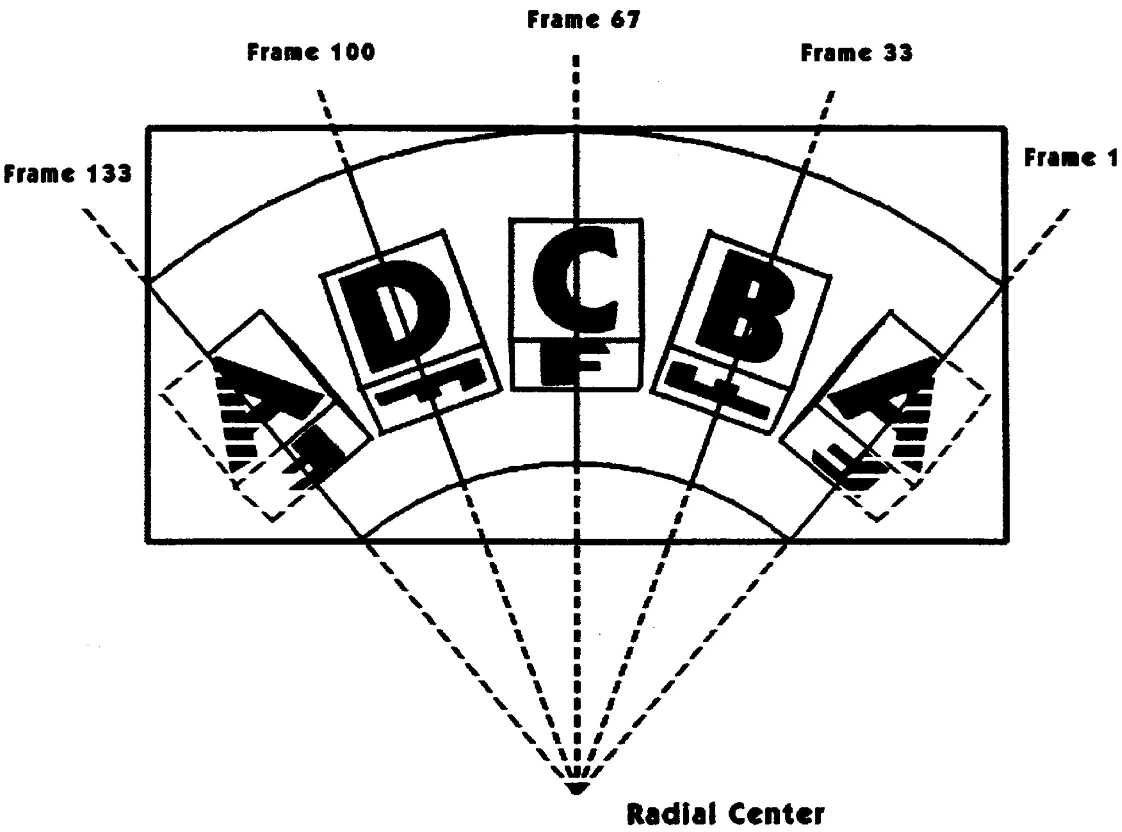
FIG. 11 illustrates the perspective sequence orientation to a tapered cylinder surface's radial center.

The tapered cylinder top circumference and a spatial frequency are used to determine a frame count for the cylindrical lenticular pattern as previously described. A sequence representing 360 degrees of perspective is created wherein the subject appears to rotate counter clock-wise 360 degrees around the subject's Y axis while rotating relative to the view's X axis in a counter clock-wise direction starting at an angle that is half the cup angle clock-wise from the view's Y axis and ending at an angle that is half the cup angle counter clock-wise from the view's Y axis. Also the subject appears to be rotated in the view's Z by the taper angle so that the bottom of the subject is toward the view and the top is away. Additionally the subject's center moves up on the view's Y axis starting at a point that is half the cup rise distance below the center of the view to a point that is half the cup rise distance above the center of the view and then moving down from the view's center on the Y axis the cup rise distance. FIG. 10 illustrates a perspective sequence where a spinning cube, that is tilted back, rotates counter clock-wise while moving up and down in the view over 133 frames. FIG. 11 shows the cube's orientation to the tapered cylindrical surface. Fames 1, 33, 67, 100 and 133 are shown to illustrate the radial relationship of the cube to the tapered cylinder surface's radial center and the dimensions of the cylindrical lenticular pattern created from the sequence. When the sequence is processed into the cylindrical lenticular pattern and viewed through a lenticular lens wrapped around the tapered cylinder the subject appears to float in the center of the tapered cylinder while maintaining a fixed perpendicular relation to the bottom of the tapered cylinder as it is rotated left or right. It is important to note that the lenticular lens and the cylindrical lenticular pattern are aligned parallel to the center of the flat view of the tapered cylindrical surface and that when wrapped around the tapered cylinder the lenticules at the join edges will be at opposing angles due to the curved surface.

Figure 12:
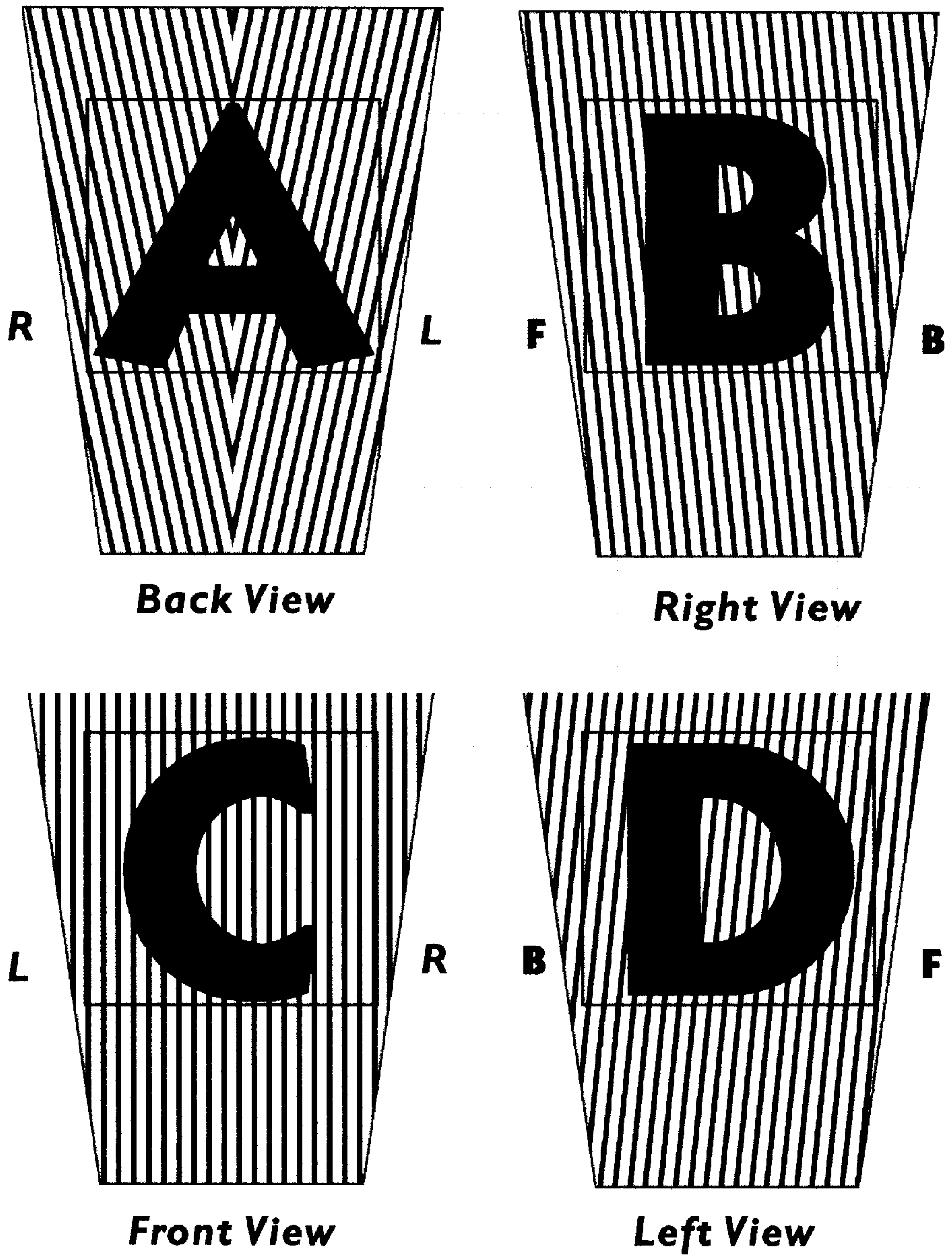
FIG. 12 illustrates the lenticular orientation and perspective sequence orientation to a tapered cylinder.

FIG. 12 shows exaggerated views of the orientation of the lenticular lens formed into a tapered cylinder with the corresponding image sequence views. The Front View shows the lenticules perpendicular to the top and bottom of the cylinder while the Back View shows the opposing angles of the lenticular lens at the image seam. It is also of note that the two halves of the first and last image in the sequences join to form a complete image. The orientation of each image's view is maintained perpendicular to the bottom due to the radial and taper adjustments applied to the image sequence. Left and right side views show the lenticular lens oriented diagonally to the horizontal center of the cylinder. In actual practice only the center most lenticule of the front view is perpendicular to the bottom of the tapered cylinder. With each successive lenticule the angle of orientation changes. The number of whole lenticules that extend from the bottom to the top of the tapered cylinder is equal to the bottom curve chord divided by the spatial frequency.

The purpose of creating the described adjustments of the subject, for use on a tapered cylinder, is to compensate for the geometry of the curved surface, i.e. tilted. Other distortions caused by the geometry of the viewing surface and/or the lenticular lens geometry can be compensated for. If the viewing cylinder was elliptical the subject may appear squashed or elongated when viewed. The original subject could be elongated or squashed proportionally. In the case of the standard cylindrical geometry the discontinuous stripes in the cylindrical pattern can be achieved with a sequence of more than 360 degrees of rotation and using only the center 360 degrees of the resulting pattern. FIG. 7*c* illustrates this point since the center of the pattern is the same as the patterns in FIGS. 4*a* and 4*b*. An additional observation is that the distortions thus applied are relative to the observer's view, which means that some or all of the distortions can be accomplished by changing the observer's view, instead of the subjects position, as long as the relative relationships in the final images are the same. For example the X direction rotation and the Y direction offset could be implemented by changing the observer's view. The combination of these techniques allow for the capture of image sequences, for various deviations in the shape of the cylindrical viewing surface, using either computer visualization and/or photo-mechanical processes.

Image sequences can be created from any multiple imaging source including motion picture film, video tape, digitized drawings or computer graphic images. Many existing animation, film and video sequence can be used for single perspective projects. 3D sequences can be shot using rotational stages, motion controlled cameras, aerial fly around or extracted from computer generated virtual 3D environments.

Figure 13:
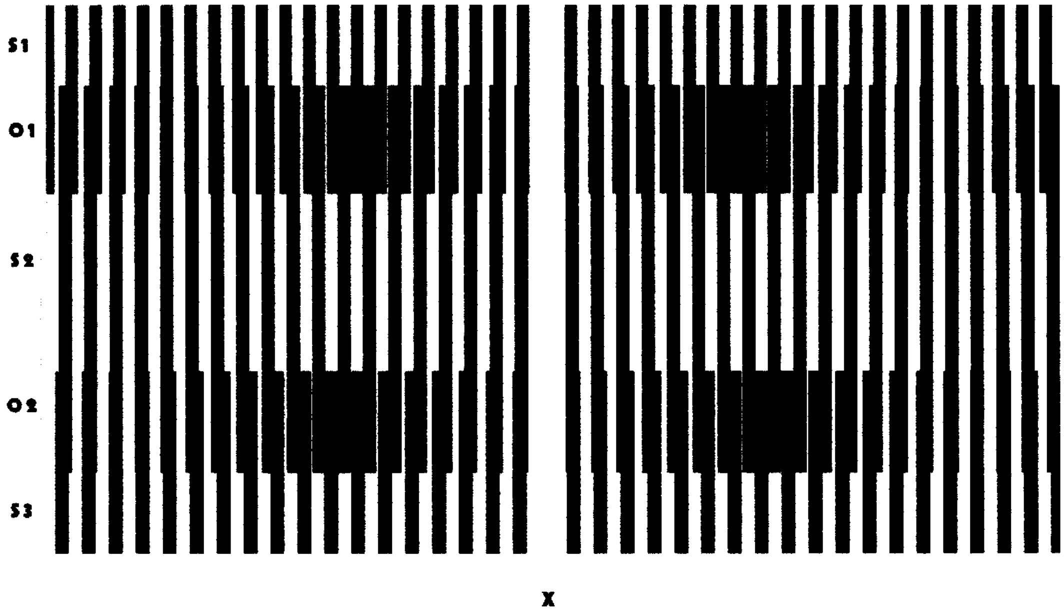
FIG. 13 illustrates a Center Phase Alignment Pattern that simplifies alignment of the cylindrical lenticular pattern with the viewing screen.
Figure 14A:
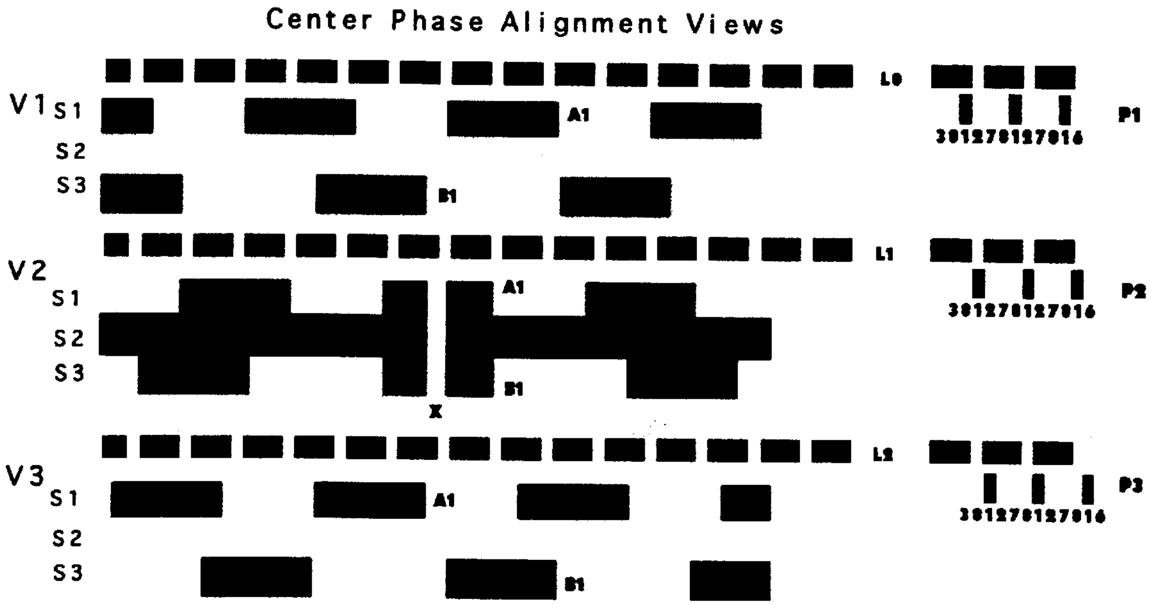
FIG. 14*a* illustrates the operation of the Center Phase Alignment Pattern as viewed flat through a Ronchi ruling.
Figure 14B:
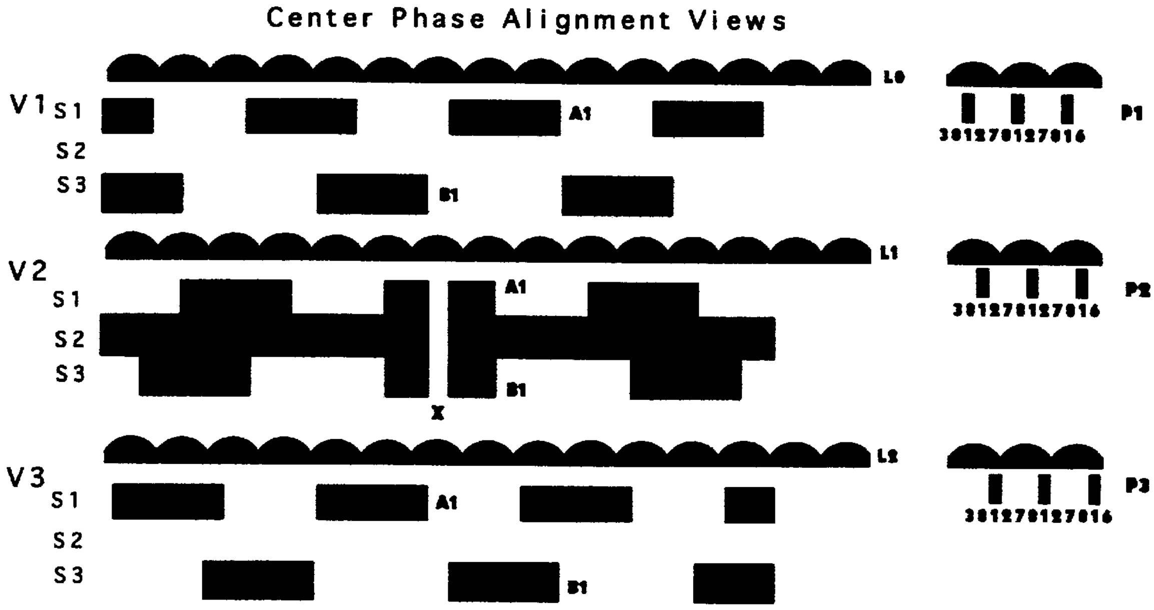
FIG. 14*b* illustrates the operation of the Center Phase Alignment Pattern as viewed flat through a lenticular lens.

Aligning the interlaced image with the lenticular lens is crucial to the success of the lenticular image. FIG. 13 illustrates a center phase alignment pattern which represents the information placed at the top and bottom of an interlaced image for the purpose of verifying the alignment of the lenticular lens or Ronchi ruling with the lenticular image. This alignment procedure is illustrated by the Center Phase Alignment Views, FIGS. 14*a* and 14*b* showing the banding created by the Center Phase Alignment Pattern. S2 is a striping pattern at the lenticular frequency LP corresponding to the center frame or frames of an interlaced sequence. The pattern can be generated by adding black or white lines to the top and bottom of each frame in the sequence with black indicating the frame or frames to be used in the alignment, usually the center frame or frames. The pattern could be created separately and added to the interlaced image, but the other process is simpler in production. S1 and S3 are striping patterns that are center aligned with S2, indicated by X, a skipped stripe. A proportional relationship with S2 is defined for S1 and S3 with the following formula:

BW—length of the center phase alignment bands. i.e. 2 inches

LP—lenticular lens or Ronchi ruling pitch in BW units of patten S2. i.e. 4 lines per inch.

BC—number of bars per center phase alignment band. i.e. 1

S1%=((BW*LP)−BC)/(BW*LP)

S3%=((BW*LP)−BC)/(BW*LP)

Figure 15:
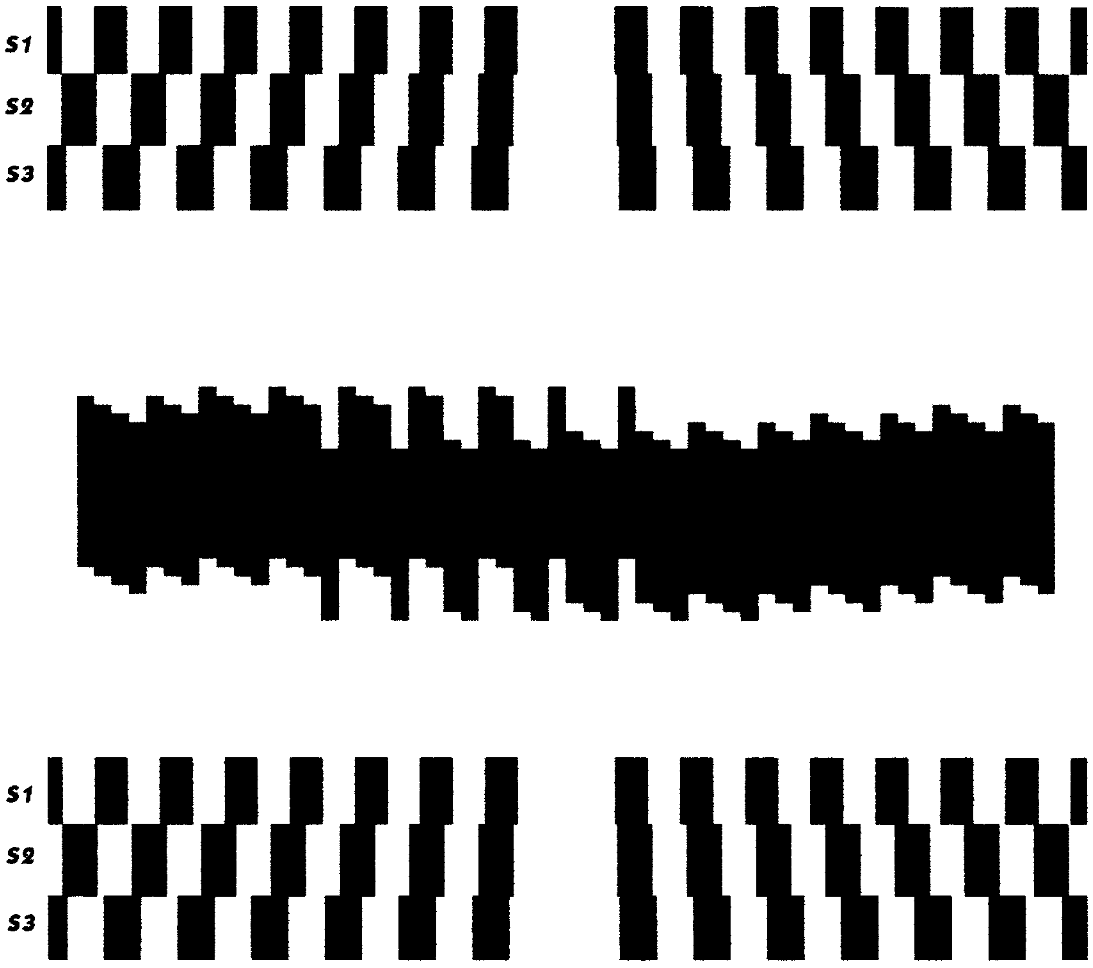
FIG. 15 illustrates the alignment patterns and lenticular image orientation.

Therefore if pattern S2 represents lenticular frequency LP then the lenticular frequency of S1 is S1% of S2 and the frequency of S3 is S3% of S2. The pattern S1 and S3 can be rendered by adjusting the width of a copy of S2, dithering the size by the percentage calculated. An alternate method would be to render S1 and S3 at a lenticular frequency of LP+1 and LP−1 and dithering the pattern to the output resolution. The first approach is preferred for consistent results across different lenticular frequencies because the LP of the lenticular lens may be rounded to a whole number. In any case the objective is to make pattern S1 with a slightly larger lenticular frequency and S3 with a slightly smaller lenticular frequency. O1 and O2 are for demonstrating the preferred frequential pattern created by the relationship of S1 and S3 to S2. O1 is the superimposed image of S1 and S2 while O2 is the superimposed image of S3 and S2. The patterns, O1 and O2, thus showing graphically the frequential alignment of the patterns S1 and S3 with S2. When S1 and S3 are viewed through a lenticular lens (L0, L1, L2) or a Ronchi ruling (L0, L1, L2), as shown on the Center Phase Alignment Views illustration, with the same lenticular frequency as pattern S2, a sequence of bars will be observable where the number of bars every BW distance will be equal to BC. V1, V2 and V3 illustrate the observer's view moving from left to right of center, the bars on S1 will move from right to left and the bar on S3 will move from left to right. If the lenticular sheet moves left while the observer is stationary the bars on S1 move left to right and the bars on S3 will move right to left. A single white line X appears fixed in the center as the bars move. Since S2 matches the frequency of the lenticular lens the observer will see either all black or all white depending upon the observers view. If the lenticular lens is aligned with the grid such that an observer perpendicular to the center of the grid sees S2 as all black and S1 and S3 have a bar A1 and B1 evenly split by the white line X as shown in V2 the lens is Center Phased with the lenticular image. Specifically this means that the stripes of the center image or images are oriented at the center of a lenticule as shown with P2. P1 and P3 show left and right dominant alignments. The alignment procedure is easier to discern with one eye closed and could be automated using electric eyes. The grid also functions as a QC tool. S2 verifies the matching of the lenticular frequency while S1 and S3 can verify registration between colors when reproduction uses a multiple color imaging process such as lithograph or screen printing. Also, when S1 and S3 have the same frequency (i.e. bands are vertically aligned), then image frequency and lens frequency are matched for the optimal view distance. FIG. 15 shows a pair of patterns S1, S2 and S3 arranged adjacent to the opposite ends of a lenticular image's stripes. This arrangement can be used to verify that the lenticular lens or Ronchi ruling is parallel to the lenticular image.

Figure 16:
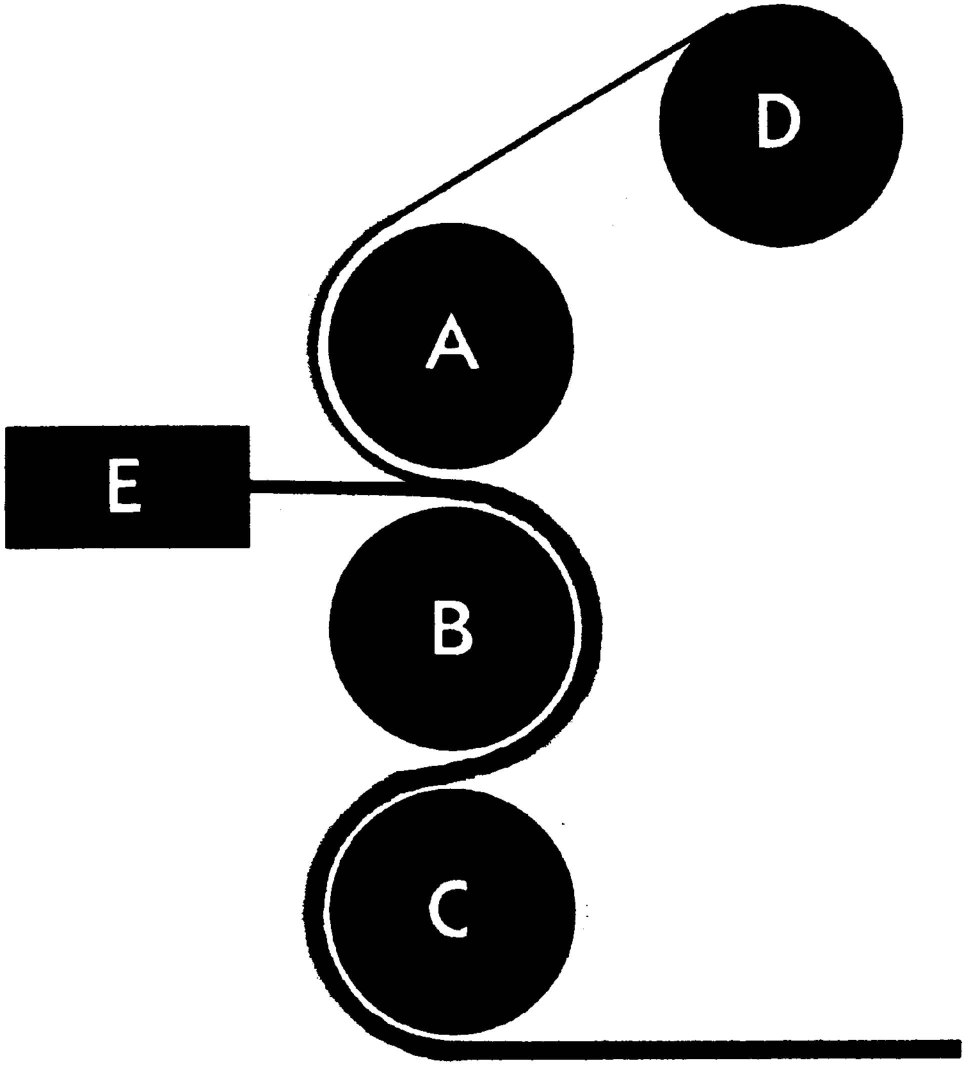
FIG. 16 illustrates a method of joining an interlaced pattern directly to a lens as it is extruded and formed.

FIG. 16 illustrates a method of applying a lenticular lens to a length of lenticular image substrate where the lenticular lens is extruded directly on to the lenticular image substrate. An extrusion stack consisting of three rollers is represented by A, B and C. Roller B is engraved with a lenticular pattern. Roller D is a length of substrate with lenticular images already printed on its outer surface. The surface can be coated with a heat activated adhesive. An extrusion injector E presents semi-liquid optically clear plastic between rollers A and B. Roller A guides the lenticular image substrate and combined with roller B acts as a nip to form the lenticular lens in direct contact with the lenticular substrate. The space between roller A and B should be equal to the focus thickness for the lenticular pattern engraved on roller B plus the thickness of the lenticular image substrate. Roller C is a chill roller that cools the plastic below it's forming temperature. The combined lenticular lens and lenticular image substrate can be placed on another roll or sheeted as desired.

The arrangement of rollers could be different. The lenticular image substrate could be introduced between rollers B and C. In this case roller C would be heated and another roller, not shown, would be used as the chill roller. The novel concept is the coating, i.e. lenticular lens on the lenticular image substrate in-line during the extrusion process. However, extrusion coating of non-lenticular image substrates is commonly utilized. The process is sometimes called calender coating. The equipment would need to provide for side to side adjustment of the lenticular substrate delivery to ensure the proper alignment of the lenticular lens thus formed with the lenticular image on the substrate.

The QC pattern would be very useful in the alignment procedures, particularly if a set of optical position detectors were used to automatically align the image with the lens. The QC pattern would also allow for automatically adjusting the thickness of the extrusion to ensure the proper focus of the lenticular lens's thus formed.

Although preferred embodiments of the present invention have been described in the foregoing Detailed Description and illustrated in the accompanying drawings, it will be understood that the invention is not limited to the embodiments disclosed, but is capable of numerous rearrangements, modifications, and substitutions of steps without departing from the spirit of the invention. Accordingly, the present invention is intended to encompass such rearrangements, modifications, and substitutions of steps as fall within the scope of the appended claims.

We claim:

1. A method of producing a curved lenticular image comprising the steps of:

(a) interlacing a plurality of source images, which have been converted into spaced-apart image stripes, to form an interlaced image wherein each source image is offset from an adjacent source image by a stripe offset equal to the product of a (lenticular offset times a lenticular phase) minus one image stripe;

(b) printing said interlaced image onto a substrate;

(c) forming said substrate into a curved surface; and (d) viewing said interlaced image through a superposing lenticular lens.

2. The method of claim 1, wherein the image stripes of each source image include only a portion of their respective source images.

3. The method of claim 2 wherein said substrate is a surface of said lenticular lens.

4. The method of claim 1, wherein said curved surface is one of a cylinder with an elliptical cross-section, a cylinder with a circular cross-section, and a tapered cylinder having a changing cross-sectional diameter in a length of the cylinder.

5. The method of claim 1 further comprising the prior step of:

(a0) dividing each source image, of a plurality of source images, into an aperture containing plural image stripes, wherein the width of each image stripe is equal to a lenticular pitch divided by a lenticular phase.

6. The method of claim 5, wherein step (a) or step (a0) is conducted using a photosensitive medium and a ruling or using a computer.

7. The method of claim 1, wherein each source image is a different image of a subject taken from a different spatial perspective relative to the subject.

8. The method of claim 1, wherein each source image is a different image of a subject in motion.

9. The method of claim 1 further comprising the step of:

aligning the image stripes of the interlaced image with the lenticules of a lenticular lens that will be used to view the interlaced image and form the lenticular image.

10. The method of claim 9 further comprising the step of matching a spatial frequency of the interlaced image to a lenticular frequency of a lens through which the interlaced image will be viewed.

11. The method of claim 9 further comprising the step of resizing or dithering one or more of said source images and said interlaced image to compensate for a geometry of the lenticular lens through which said interlaced image will be viewed.

12. The method of claim 9, wherein the subject of the plurality of source images maintains a radial orientation around a radial center of the surface of a tapered cylinder that has been spread out as a flat surface.

13. The method of claim 9, wherein a viewing width of each of said source image is between 10 percent and 50 percent of the circumference of a cylinder when said interlaced image is viewed through a cylindrical lenticular lens.

14. The method of claim 9, wherein an aperture of each source image, before interlacing, comprises pairs of transparent and opaque stripes.

15. A method of creating an interlaced image, for viewing through a curved viewing element, from a plurality of source images comprising the steps of:

(a) providing a sequence of plural source images;

(b) dividing each of said source images into respective apertures comprising spaced-apart image stripes, wherein the width of each image stripe is equal to the quotient of a viewing element pitch divided by a viewing element phase;

(c) interlacing the image stripes from a first aperture with the image stripes from a second aperture to form a first partial interlaced image, wherein the image stripes of the first aperture are offset from the image stripes of the second aperture by a stripe offset equal to the product of (a viewing element offset times the viewing element phase) minus one stripe;

(d) interlacing the image stripes from a third aperture with the image stripes of the first partial interlaced image to form a second partial interlaced image, wherein the image stripes of the third aperture are offset from the image stripes of the second aperture by the same stripe offset of step (c);

(e) repeating step (d) as needed until all of the image stripes are interlaced to form an interlaced image having a spatial frequency such that the image stripes of each image are spatially offset in relation to the previous image in the sequence by a distance equal to the stripe offset;

(f) matching the spatial frequency of the interlaced image to the lenticular frequency of a lens through which the interlaced image will be viewed;

wherein, the viewing element is a lenticular lens comprising plural lens units or a ruling comprising plural ruling units;

the viewing element pitch is equal to a unit of distance of width per viewing element unit;

the viewing element phase is the number of image stripes per viewing element unit;

the viewing element offset is a whole number.

16. The method of claim 15 wherein the spatial frequency of the interlaced image is approximately equal to the ruling frequency of a Ronchi ruling through which the interlaced image will be viewed.

17. The method of claim 15, wherein said image stripes are horizontal image stripes.

18. The method of claim 15, wherein said image stripes are vertical image stripes.

19. The method of claim 15 further comprising the step of printing said interlaced image onto a substrate.

20. The method of claim 15 further comprising the step of resizing or dithering one or more of said source images and said interlaced image to compensate for a geometry of a viewing element through which said interlaced image will be viewed.

21. The method of claim 15 wherein the subject of the plurality of sequential images maintains a radial orientation around a radial center of the surface of a tapered cylinder that has been spread out as a flat surface.

22. The method of claim 15 wherein a viewing width of each of said source images is between 10 percent and 50 percent of the circumference of a cylinder when said interlaced image is viewed through a cylindrical lenticular lens.

23. The method of claim 15, wherein the apeture of each source image, before interlacing, comprises pairs of transparent and opaque stripes.

24. The method of claim 15, wherein the number of sequential images exceeds the viewing element phase.

25. The method of claim 15, further comprising the step of:

(f) viewing the interlaced image through a curved viewing element selected from the group consisting of a cylinder with an elliptical cross-section, a cylinder with a circular cross-section, and a tapered cylinder having a changing cross-sectional diameter in a length of the cylinder.

26. A method of photographically creating an interlaced image from a plurality of sequential images comprising the steps of:

(a) exposing a first image in the sequence through a ruling having an array of spaced-apart linear holes onto a first location of a recording medium at a first position with an imaging device; and (b) offsetting only the recording medium to a second position relative to the imaging device and ruling or alternately offsetting both the imaging device and the ruling relative to the recording medium by a distance equal to the product of (a ruling offset times a ruling phase) minus a width of one linear hole from the first position;

(c) exposing a second image in the sequence through the ruling onto a second location of the recording medium at the second position;

(d) repeating steps (b) and (c) until all of the images have been exposed onto different locations of the recording medium to form an interlaced image.

27. The method of claim 26 wherein said ruling is a lenticular lens or Ronchi ruling.

28. The method of claim 26, wherein the images exposed through the ruling include only a portion of their respective images.

29. The method of any one of claims 1 or 26, wherein the interlaced image is resized or dithered such that the spatial frequency of the interlaced image matches the lenticular frequency of a lenticular lens which will be used to view the interlaced image.

30. A method of correctly aligning an interlaced image with a lenticular lens to form a correct lenticular image comprising the steps of:

(a) creating a first alignment striped pattern with a first spatial frequency;

(b) creating a second alignment striped pattern with a second spatial frequency different and larger than said first spatial frequency;

(c) creating a third alignment striped pattern with a third spatial frequency different and smaller than said first spatial frequency;

(d) grouping said first, second and third alignment striped patterns into groups, wherein a first group is grouped adjacent a first edge of said interlaced image and a second group is grouped adjacent a second edge and apposite the first edge of said interlace image, and wherein at least a portion of each pattern is aligned with said interlaced image; and (e) viewing said alignment striped patterns and said interlaced image through said lenticular lens; and (f) verifying alignment of interlaced image and at least one of said alignment striped patterns with said lenticular lens.

31. The method of claim 30 wherein all of said alignment striped patterns are center aligned.

32. The method of claim 30 wherein the step of verifying alignment includes verifying the matching of the spatial frequency of one of the striped patterns with the lenticular frequency of the lenticular lens.

33. The method of claim 32 wherein the second alignment pattern is center aligned with the interlaced image.

34. The method of claim 30 further comprising the step of:

printing said alignment striped patterns and said interlaced image on the same substrate.

35. The method of claim 30 wherein the first alignment striped pattern and the third alignment striped pattern are used to verify registration between colors in a multiple color interlaced image.

36. The method of claim 30, wherein interference patterns are created by viewing said alignment striped patterns through said lenticular lens.

37. The method of claim 30 further comprising the step of modifying the first and second striped patterns to visually differentiate a known stripe of each of the patterns.

38. The method of claim 37 wherein the width of each stripe is equal.

39. The method of claim 38 wherein the width of each stripe approximates the width of a corresponding stripe of the lenticular image.

40. The method of claim 30 further comprising the step of:

detecting misalignment of the lenticular with at least one of said interlaced image, said first alignment striped pattern, said second alignment striped pattern, and said third alignment stripped pattern with an electronic detector.

41. A method of forming an interlaced image from a sequence of plural source images for viewing through a cylindrical lenticular lens, the method comprising the steps of:

selecting a lenticular lens with a lenticular frequency and lobe angle;

selecting a diameter of a cylindrical lens through which the interlaced image will be viewed;

calculating an aperture width, wherein the aperture width is equal to (the lobe angle/360) times (pi times the diameter);

calculating the number of lenticules per aperture, wherein the number of lenticules per aperture is equal to (the aperture width times the lenticular frequency);

selecting a lenticular offset of at least 1;

calculating a lenticular phase, wherein the lenticular phase is equal to the number of lenticules per aperture divided by the lenticular offset rounded to whole number;

calculating a number of image stripes per inch, wherein the number of image stripes is equal to (the lenticular phase times the lenticular frequency);

calculating an image stripe offset, wherein the image stripe offset is equal to (the lenticular offset times the lenticular phase) minus one;

rendering each source image of a plurality of source images as a respective aperture having the above-calculated stripes per inch where the number of stripes is equal to ((the stripe offset plus one stripe)times the lenticular phase); and interlacing said apertures in a cascading overlap pattern wherein said apertures are offset in relation to the previous aperture by the above-calculated stripe offset to form an interlaced image.

42. The method of claim 41 further comprising the step of:

resizing or dithering one or more of said source images and said interlaced image to compensate for a geometry of a lenticular lens through which said interlaced image will be viewed.

43. The method of claim 41, wherein the interlaced image is resized or dithered to match the lenticular frequency of a lenticular lens which will be used to view the interlaced image.

* * * * *